United States Patent [19]

Isawa et al.

[11] Patent Number: 5,652,199

[45] Date of Patent: Jul. 29, 1997

[54] METHOD OF MANUFACTURING OXIDE SUPERCONDUCTOR

[75] Inventors: Kazuyuki Isawa, Sendai; Ayako Yamamoto, Minamiashigara; Seiji Adachi, Fujimi; Makoto Itoh, Tokyo; Hisao Yamauchi, Nagareyama, all of Japan

[73] Assignees: International Superconductivity Technology Center, Tokyo; Tohoku Electric Power Company, Inc., Miyagi; Sumitomo Electric Industries, Ltd., Osaka, all of Japan

[21] Appl. No.: 360,407

[22] Filed: Dec. 21, 1994

[30] Foreign Application Priority Data

Dec. 27, 1993 [JP] Japan ................................. 5-331788

[51] Int. Cl.[6] ........................... C04B 35/64; H01L 39/24
[52] U.S. Cl. ........................ 505/441; 505/490; 505/500
[58] Field of Search ................................ 505/124, 125, 505/441, 490, 500; 264/61, 65, 56

[56] References Cited

PUBLICATIONS

Hur et al. "A Mercury–Based Superconductor with a $T_c$ of 132K" Materials Research Bulletin vol. 29, No. 9, pp. 959–964 Sep. 1994.

Physica C Superconductivity, vol. 215, 1993, E.V. Antipov et al, "The synthesis and characterization of the HgBa2Ca2Cu3O8+delta and HgBa2Ca3Cu4O10+delta phases".

Physica C. Superconductivity, vol. 216, 1993, A. Tokiwa–Yamamoto et al, "Composition crystal, structure and superconducting properties of Hg–Ba–Cu–O and Hg–Ba–Ca–Cu–O superconductors".

Physica C Superconductivity, vol. 217, 1993, K. Isawa et al, "The effect of Pb doping in HgBa2Ca2Cu3O8+ delta superconductor".

Modern Physics Letters B, vol. 7, No. 28, Dec. 10, 1993, Y.Y. Xue et al "Pb–Doping Effects in Hg1–xPbxBa2Ca2Cu3O8+ delta".

Schilling; "Superconductivity Above 130K in the Hg–Ba–Ca–Cu–O System"; May 6, 1993; pp. 56–58; Letters To Nature.

Hirabayashi; "High–Pressure Synthesis of $HgBa_{2Ca2}Cu_3O_{g-x}$ Superconductor with $T_c > 130K$"; Sep. 1, 1993; pp. 1206–1207; Jpn. J. Apply. Phys. vol. 32, Part 2.

Primary Examiner—Christopher A. Fiorilla
Attorney, Agent, or Firm—Frieshauf, Holtz, Goodman, Langer & Chick, P.C.

[57] ABSTRACT

A method of manufacturing an oxide superconductor, including the steps of mixing oxide materials of the metals contained in an oxide superconductor represented by $HgBa_2Ca_2Cu_3O_{8+y}$ to prepare a powder mixture of the composition noted above, molding the powder mixture to prepare a molded body of a desired shape, and applying a heat treatment to the molded body within a hermetic container at a temperature sufficient for bringing about a solid phase reaction of the oxide materials for at least 20 hours. Also provided is a method of manufacturing an oxide superconductor, including the steps of mixing at least one additive element selected from the group consisting of Pb, Bi, Tl, Au, Pt, Ag, Cd and In with oxide materials of the metals contained in a Hg-series 1223 type oxide superconductor to prepare a powder mixture, molding the powder mixture to prepare a molded body of a desired shape, and applying a heat treatment to the molded body within a hermetic container at a temperature sufficient for bringing about a solid phase reaction of the oxide materials for at least 10 hours.

13 Claims, 5 Drawing Sheets

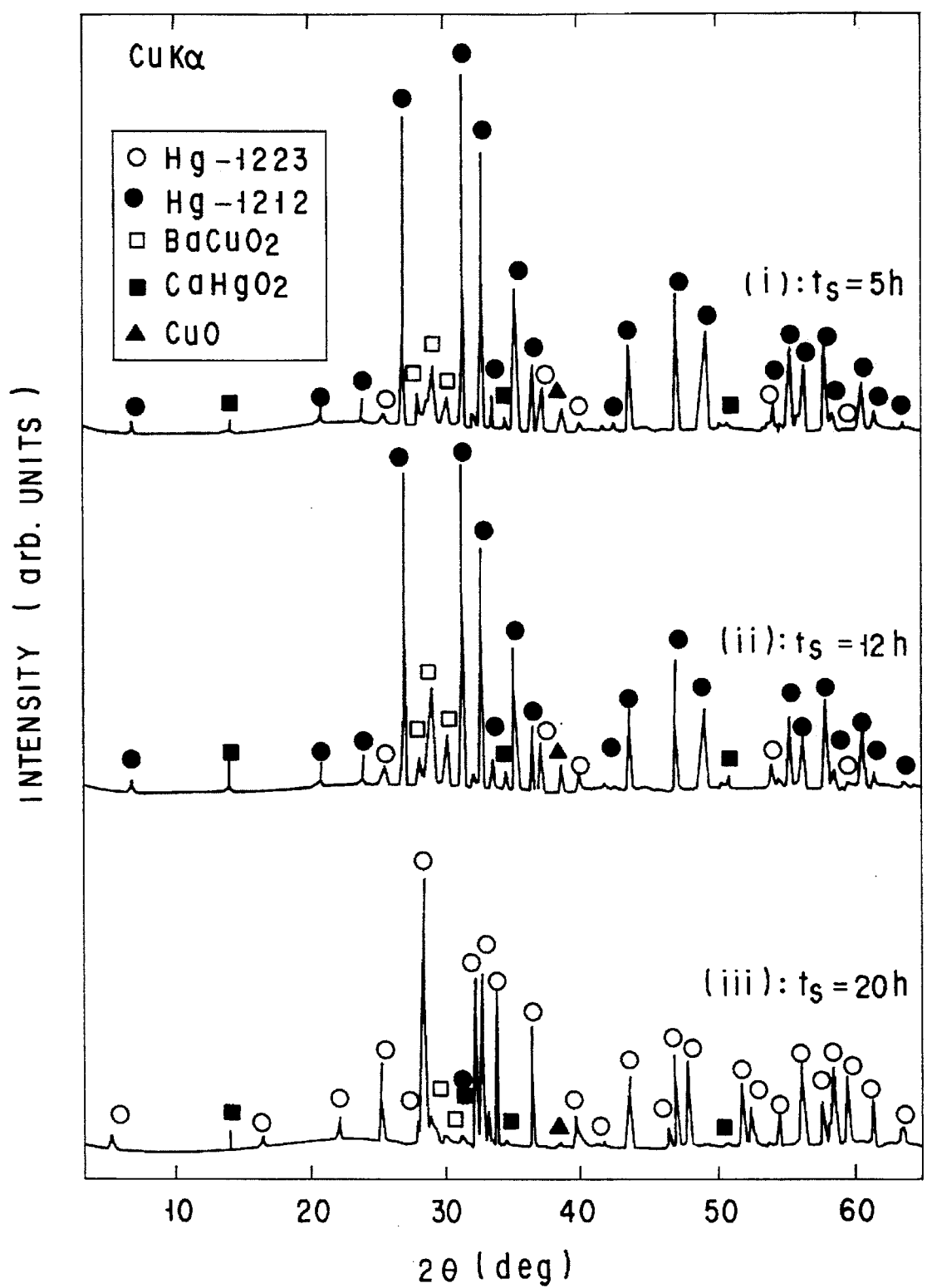
F I G. 1A

METHOD OF MANUFACTURING OXIDE SUPERCONDUCTOR

BACKGROUND OF THE INVENTION

1. Field of the Invention

The present invention relates to a method of manufacturing a Hg-series 1223 type oxide superconductor which exhibits superconductive characteristics at temperatures higher than the liquid nitrogen temperature.

2. Description of the Related Art

A superconductor exhibits various characteristics which cannot be found in other substances. Specifically, the electrical resistance of the superconductor is rendered zero at temperatures lower than a critical temperature Tc, with the result that the superconductor exhibits a complete diamagnetism and produces Josephson effects. Because of these characteristics, the superconductor is expected to be used for forming, for example, a power cable without current loss, a superconducting generator, a material for high field magnets for nuclear fusion plasma confinement, a material for magnetic levitation vehicle, a magnetic shielding material, and a high speed computer.

Since Bednorz and Muller found in 1986 a La—Ba—Cu—O series superconductor having a Tc of about 30K, it is reported that superconductivity has been recognized in about 30 kinds of copper oxides. Particularly, a Tl—Ba—Ca—Cu—O series superconductor having a Tc of 125K has attracted attention as a superconductor exhibiting the highest Tc. On the other hand, it has been reported recently that a Hg—Ba—Ca—Cu—O series superconductor (1223 type) exhibits a Tc of 133.5K (A. Schiling et al., Nature (London) 363,56 (1993)).

The Hg—Ba—Ca—Cu—O series oxide superconductor of substantially single phase ceramics can be produced by a synthetic method, which necessitates an ultra-high pressure of 5 to 6 GPa (H. Hirabayashi et al., Jpn. J. Appl. Phys. 32, L1206 (1993)). The synthetic method necessitating such an ultra-high pressure requires an ultra-high pressure synthetic apparatus which is highly costly and, thus, is not adapted for mass production of the oxide superconductor. In addition, the particular synthetic method permits producing an oxide superconductor in only such a small amount as about 10 mg in a single operation. Further, the obtained oxide superconductor does not have a single phase completely.

Also known is a method of obtaining a Hg series oxide superconductor without requiring an ultra-high pressure. In this method, a powder mixture is prepared by mixing HgO with a complex oxide such as a $Ba_2Ca_2Cu_3O_7$ complex oxide, or a complex oxide of $BaCuO_2$ and $Ca_2CuO_3$, followed by shaping the powder mixture and subsequently applying a heat treatment to the shaped body at 800° to 850° C. for 5 to 10 hours. However, the resultant Hg series oxide superconductor contains many impurity phases, leading to a low volume fraction, i.e., less than 90% and a Meissner signal less than 10%.

SUMMARY OF THE INVENTION

The present invention, which has been achieved in view of the situation described above, is intended to provide a method of manufacturing an oxide superconductor, which permits easily manufacturing in a large amount a high quality Hg-series 1223 type oxide superconductor having a volume fraction of at least 90%.

According to a first aspect of the present invention, there is provided a method of manufacturing an oxide superconductor, comprising the steps of mixing oxide materials of the metals contained in an oxide superconductor represented by $HgBa_2Ca_2Cu_3O_{8+y}$ to prepare a powder mixture; molding the powder mixture to prepare a molded body of a desired shape; and applying a heat treatment to the molded body within a hermetic container at a temperature sufficient for bringing about a solid phase reaction of the oxide materials for at least 20 hours.

According to a second aspect of the present invention, there is provided a method of manufacturing an oxide superconductor, comprising the steps of mixing at least one additive element selected from the group consisting of Pb, Bi, Tl, Au, Pt, Ag, Cd and In with oxide materials of the metals contained in a Hg-series 1223 type oxide superconductor to prepare a powder mixture; molding the powder mixture to prepare a molded body of a desired shape; and applying a heat treatment to the molded body within a hermetic container at a temperature sufficient for bringing about a solid phase reaction of the oxide materials for at least 10 hours.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention, and together with the general description given above and the detailed description of the preferred embodiments given below, serve to explain the principles of the invention.

FIGS. 1A and 1B are graphs which show the results of powder X-ray diffraction applied to the Hg-series 1223 type oxide superconductor obtained by the method of the present invention;

DETAILED DESCRIPTION OF THE PREFERRED EMBODIMENTS

Figure 1B:
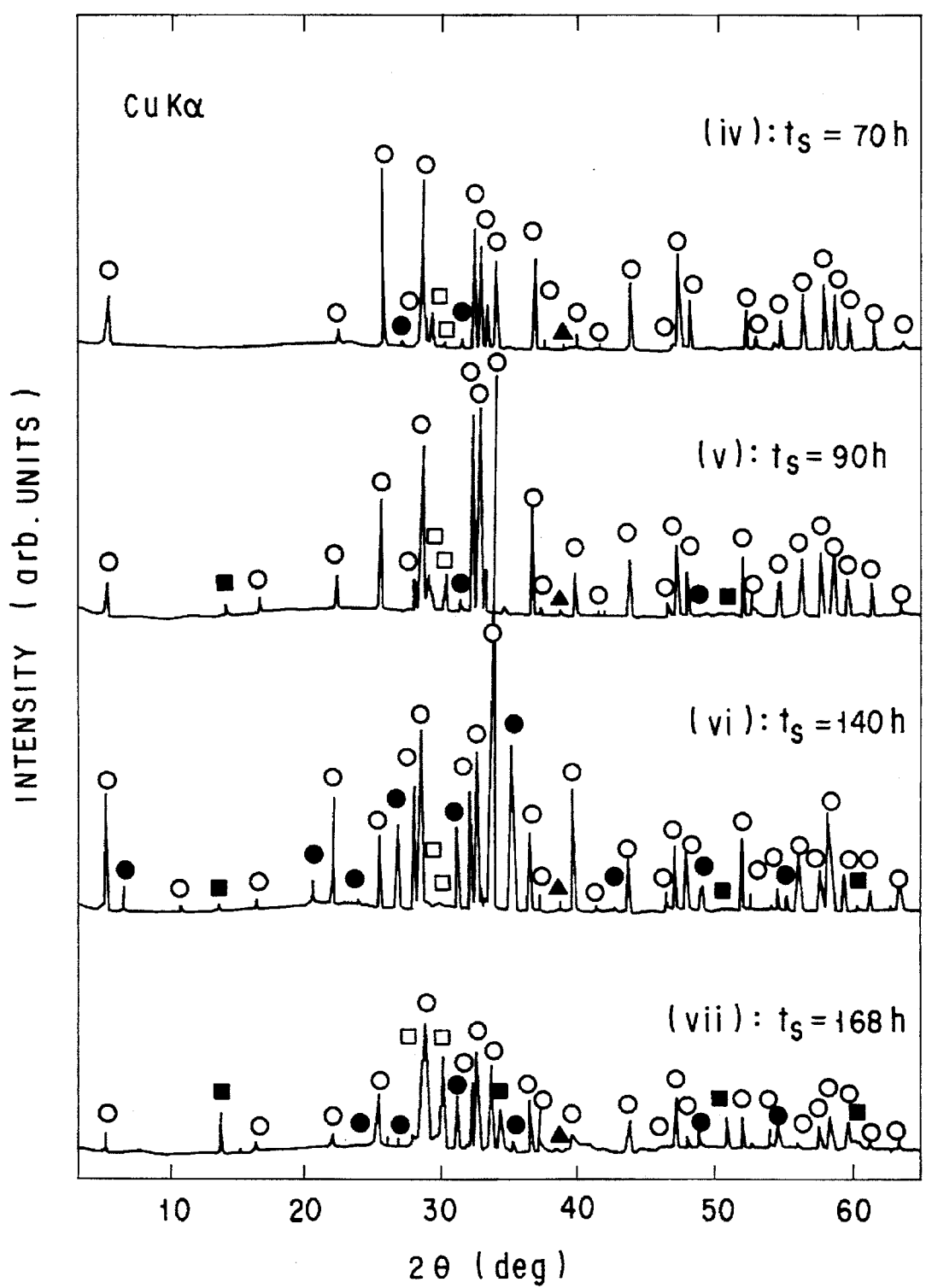

The first embodiment of the present invention is featured in that powdery oxide materials of the metals contained in an oxide superconductor represented by $HgBa_2Ca_2Cu_3O_{8+y}$ are mixed to prepare a powder mixture, followed by applying a heat treatment to a molded body of the powder mixture at a temperature sufficient for bringing about a solid phase reaction of the oxide materials for at least 20 hours. The particular method makes it possible to obtain without difficulty a high quality Hg-series oxide superconductor without requiring an ultra-high pressure.

The powdery oxide material used in the first embodiment of the present invention denotes an oxide consisting of a metal contained in the oxide superconductor to be produced and oxygen. Specifically, powdery metal oxides of HgO, BaO, CaO and CuO are mixed such that the molar ratio of Hg:Ba:Ca:Cu is 1:2:2:3 to prepare a powder mixture. An ordinary dry method, a co-precipitation method, and wet methods such as sol-gel method can be employed for mixing the powdery oxide materials. Incidentally, it is widely known to the art that the mixing ratio of the raw materials can be changed from the stoichiometric ratio. In fact, the mixing ratio is changed appropriately in the manufacture of a Tl-series or Bi-series oxide superconductor. Also, the mixing ratio of the oxide materials may be somewhat deviant from the stoichiometric ratio of Hg:Ba:Ca:Cu= 1:2:2:3 in the present invention.

The powder mixture is then molded into a molded body of a desired shape. The molding can be performed by, for example, a compression molding or rubber pressing method.

The molded body is sealed in a hermetic container and subjected to a heat treatment at a temperature sufficient for bringing about a solid phase reaction of the oxide materials for at least 20 hours. It is desirable to set the pressure within the hermetic container at $10^{-1}$ to $10^{-6}$ Torr. If the pressure within the hermetic container is higher than $10^{-1}$ Torr, the hermetic container is likely to be broken by expanding a gas within the hermetic container. On the other hand, it is difficult to prepare a high vacuum exceeding $10^{-6}$ Torr. In addition, Hg is likely to be evaporated under such a high vacuum. It is also important to apply the heat treatment at a temperature sufficient for bringing about a solid phase reaction of the oxide materials. The particular temperature denotes a temperature at which reactions among the oxide materials are performed without causing a partial melting. To be more specific, it is desirable to apply the heat treatment at 600° to 750° C. in view of the fact that the solid phase reaction temperature is lowered by the presence of Hg. If the heat treatment is carried out within the temperature range noted above, the solid phase reaction proceeds while suppressing decrease of Hg without formation of a stable impurity phase of $BaCuO_2$ or without causing a partial melting. Further, the heat treatment should be applied for at least 20 hours. If the heating time is shorter than 20 hours, impurity phases such as a Hg-series 1212 phase are mixed in the resultant Hg-series 1223 type oxide superconductor. On the other hand, the upper limit of the heating time, which depends on the conditions such as the particle size of the powdery oxide materials and the heat treating temperature, is considered to be about 120 hours.

The second embodiment of the present invention is featured in that at least one element selected from the group consisting of Pb, Bi, Tl, Au, Pt, Ag, Cd and In is added to the oxide materials of the metals contained in a Hg-series 1223 type oxide superconductor. Use of the additive element facilitates formation of the Hg-series 1223 composition, with the result that a Hg-series 1223 type oxide superconductor can be obtained easily. The Hg-series 1223 type oxide superconductor of the second embodiment is equal in crystal structure to $HgBa_2Ca_2Cu_3O_{8+y}$ in which the additive element is partially substituted for the metal in the Hg site or Cu site. It is difficult to determine the site and amount of the partially substituting element as in the determination of Pb substituted in a Bi-series oxide superconductor. As described previously, oxides consisting of the metals contained in the oxide superconductor to be produced and oxygen, i.e., HgO, BaO, CaO, and CuO, are used as oxide materials in the first embodiment of the present invention. In the second embodiment, however, complex oxides can also be used together with the metal oxides noted above as oxide materials.

In the second embodiment, at least one element selected from the group consisting of Pd, Bi, Tl, Au, Pt, Ag, Cd and In is added to the oxide materials described above. Use of the additive facilitates the production of the Hg-series 1223 type oxide superconductor easily. These additive elements can be added in the form of ions as in the method of mixing oxides of these additive elements, co-precipitation method and sol-gel method. It is desirable to add powdery materials of $MO_x$, where M is at least one element selected from the group consisting of Pb, Bi, Tl, Au, Pt, Ag, Cd and In, to the oxide materials of HgO, BaO, CaO, and CuO such that the mixing ratio of Hg:Ba:Ca:Cu:M=1:2:2:3:a (0.05<a<0.5). Where the value of a falls within a range of between 0.05 and 0.5, the Tc value of the resultant Hg-series 1223 type oxide superconductor exceeds 130K.

The second embodiment is equal to the first embodiment in the process after preparation of the powder mixture.

Let us describe some examples of the present invention.

EXAMPLE 1

Powdery materials of HgO having a purity of 99%, BaO having a purity of 99%, CaO having a purity of 99.99% and CuO having a purity of 99.99% were mixed in a stoichiometric mixing ratio of Hg:Ba:Ca:Cu=1:2:2:3 to obtain a powder mixture. The resultant powder mixture was subjected to a press-molding under a pressure of 500 kg/cm³ to obtain a rod sized 2 mm×2 mm×20 mm. The rod was put in a quartz ampule, followed by reducing the pressure within the quartz ampule to about $1\times10^{-4}$ Torr. Further, the quartz ampule was sealed using a gas burner.

The sealed quartz ampule was put in an electric furnace so as to apply a heat treatment to the rod of the powder mixture at 665° C., thereby bringing about a solid phase reaction of the powder mixture. Then, the quartz ampule was put in water for a rapid cooling. A rod-shaped oxide superconductor was taken out of the quartz ampule after the heat treatment, and followed by pulverizing the rod-shaped oxide superconductor. The resultant powdery oxide superconductor was subjected to powder X-ray diffraction. FIGS. 1A and 1B show the results. In this experiment, the time $t_s$ for the heat treatment was changed over a range of between 5 hours and 168 hours.

As seen from FIGS. 1A and 1B, a Hg-series 1223 type oxide superconductor can be obtained if the time $t_s$ exceeds 20 hours. Particularly, where the time $t_s$ is 70 hours, it is possible to obtain a Hg-series 1223 type oxide superconductor of a substantially complete single phase. Incidentally, the oxide superconductor tends to be decomposed if the time $t_s$ exceeds 128 hours. On the other hand, if the time $t_s$ is less than 20 hours, a Hg-series 1212 phase is also formed, resulting in failure to obtain an oxide superconductor of a single phase.

Figure 2A:
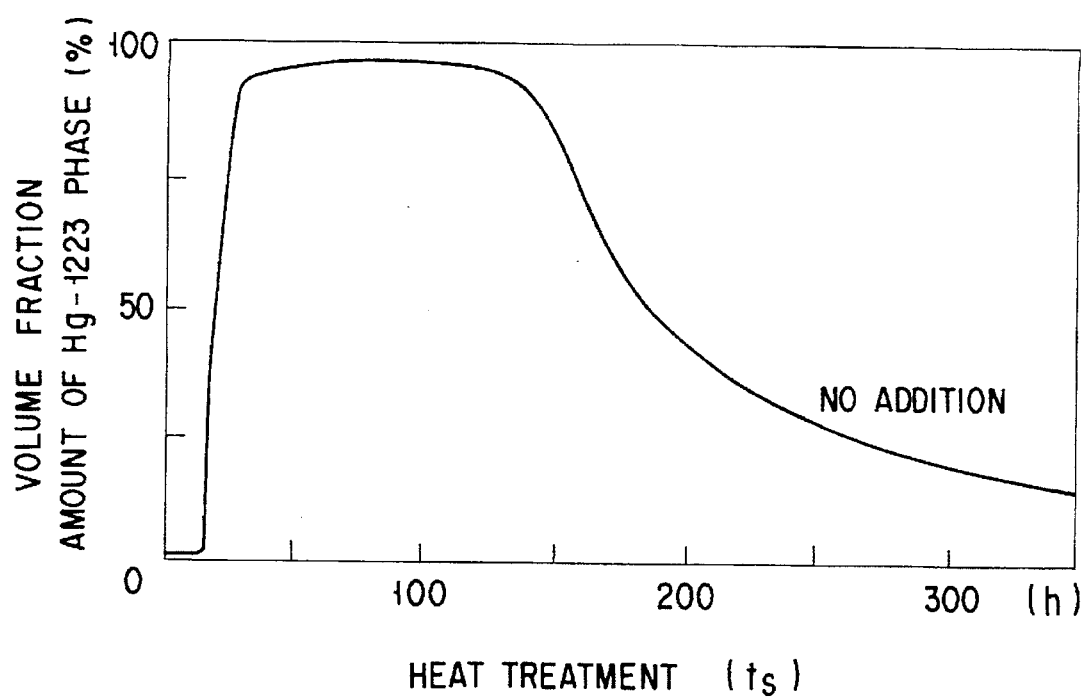
FIG. 2A is a graph showing the relationship between the heat treating time and the volume fraction, which was obtained from the results of powder X-ray diffraction applied to a Hg-series 1223 type oxide superconductor, without PbO addition.

FIG. 2A is a graph showing the relationship between the volume fraction and the time $t_s$ for the heat treatment in respect of the Hg-series 1223 type oxide superconductors prepared in Example 1. As seen from the graph, a high quality Hg-series 1223 type oxide superconductor having a volume fraction of 90% or more can be obtained where the time $t_s$ falls within a range of between 20 hours and 120 hours.

Figure 3A:
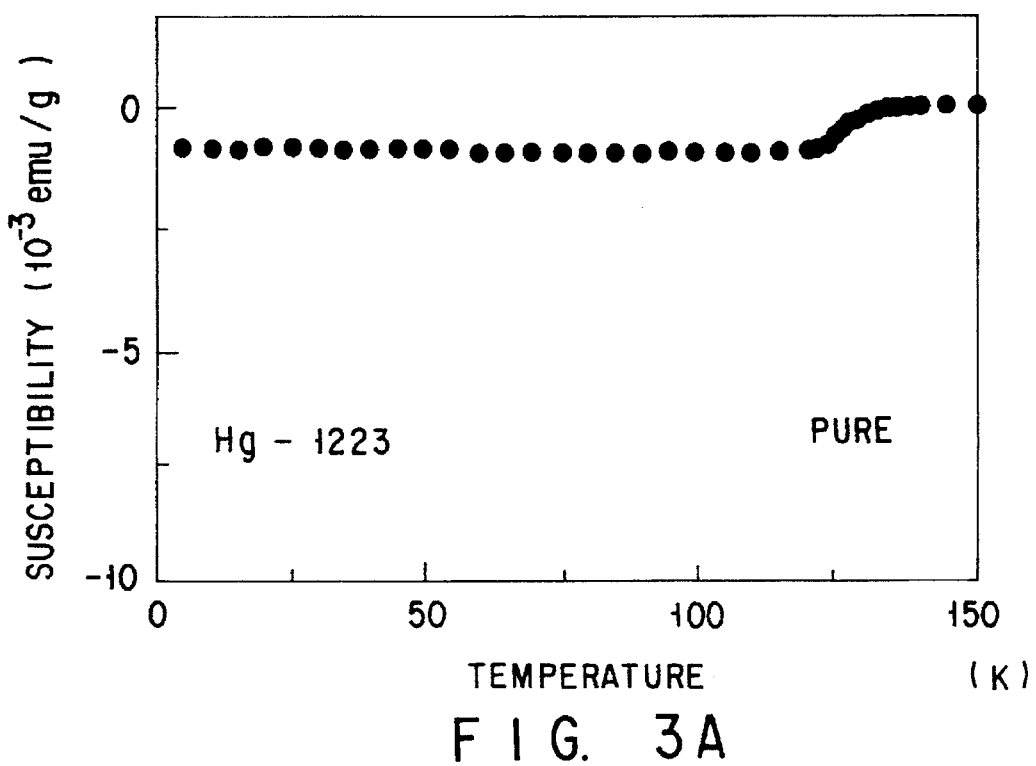
FIG. 3A is a graph showing the relationship between the heat treating time and the DC magnetic susceptibility in respect of a Hg-series 1223 type oxide superconductor, with no PbO addition.

Also examined was the relationship between the susceptibility, which was measured by a SQUID magnetometer, and the temperature in respect of the oxide superconductor involving the heat treating time $t_s$ of 70 hours, with the results as shown in a graph of FIG. 3A. As seen from the graph, the oxide superconductor exhibited satisfactory superconductive characteristics. Specifically, the oxide superconductor exhibited a diamagnetism at temperatures lower than 134K. Further, the magnitude of the Meissner signal was exceeded 10%.

EXAMPLE 2

Figure 4A:
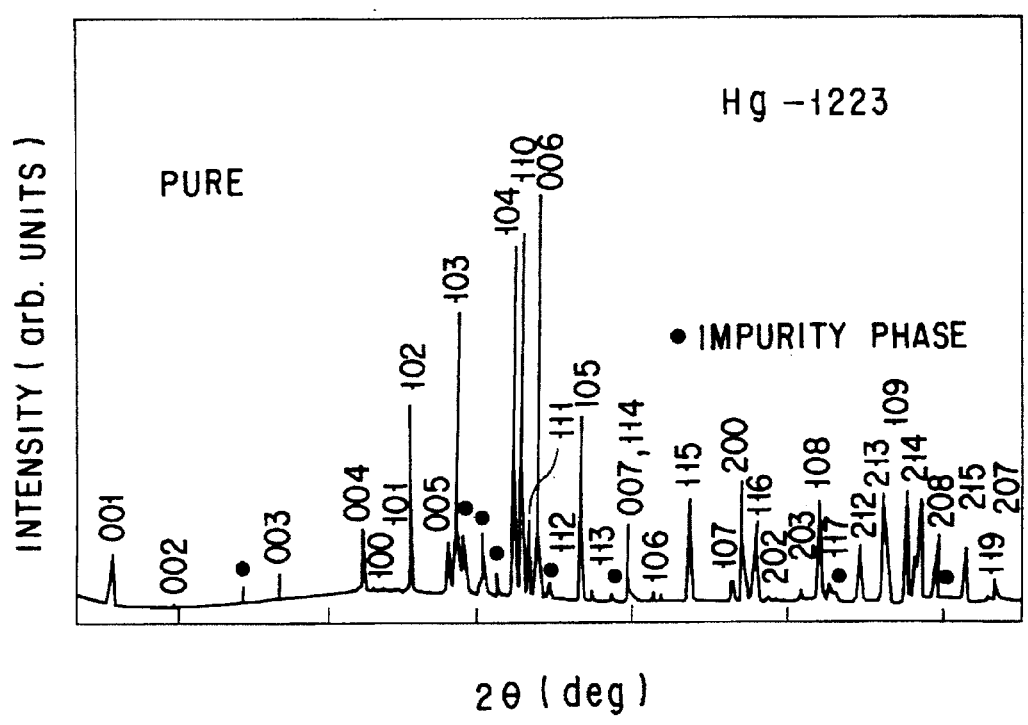
FIG. 4A shows the results of X-ray diffraction applied to a Hg-series 1223 type oxide superconductor, without PbO addition, obtained by the method of the present invention.
Figure 4B:
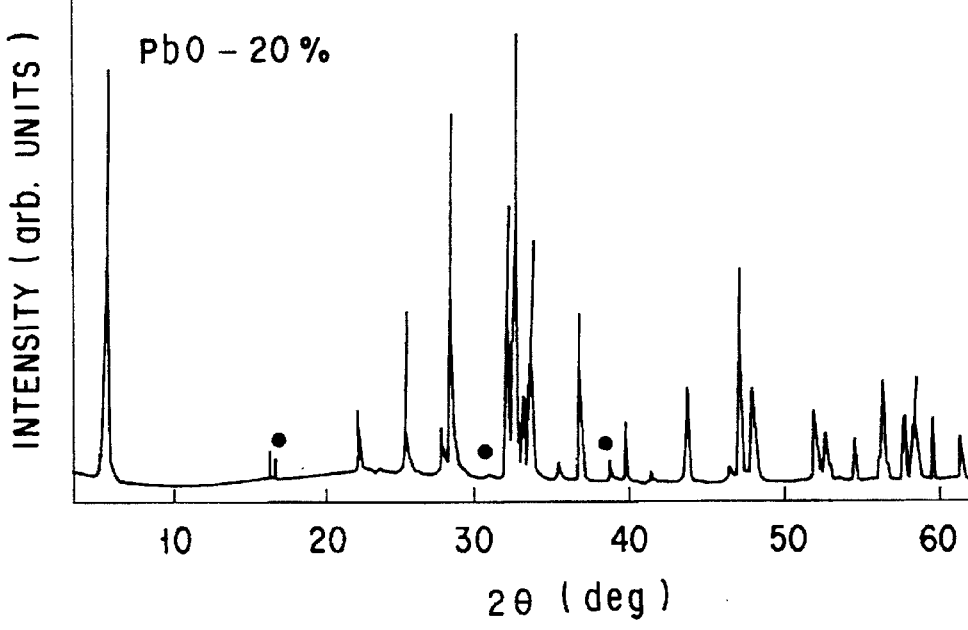
FIG. 4B is a graph which shows the results of X-ray diffraction applied to a Hg-series 1223 type oxide superconductor, with PbO addition, obtained by the method of the present invention.

Powdery materials of HgO having a purity of 99%, BaO having a purity of 99%, CaO having a purity of 99.99%, CuO having a purity of 99.99% and PbO having a purity of 99.9% were mixed in a stoichiometric mixing ratio of Hg:Ba:Ca:Cu:Pb=1:2:2:3:0.2 (PbO addition: 20 mol %) to obtain a powder mixture. A PbO-added Hg-series 1223 type oxide superconductor was prepared as in Example 1 by using the resultant powder mixture, followed by applying a powder X-ray diffraction to the oxide superconductor thus prepared. FIG. 4B shows the results. In this experiment, the heat treatment was applied for 168 hours. For comparison, FIG. 4A shows the results of powder X-ray diffraction applied to an Hg-series 1223 type oxide superconductor. In this case, PbO was not added, and the heat treatment was applied for 70 hours. As apparent from FIG. 4B, the PbO addition made it possible to obtain an Hg-series 1223 type oxide superconductor of a substantially single phase.

Figure 2B:
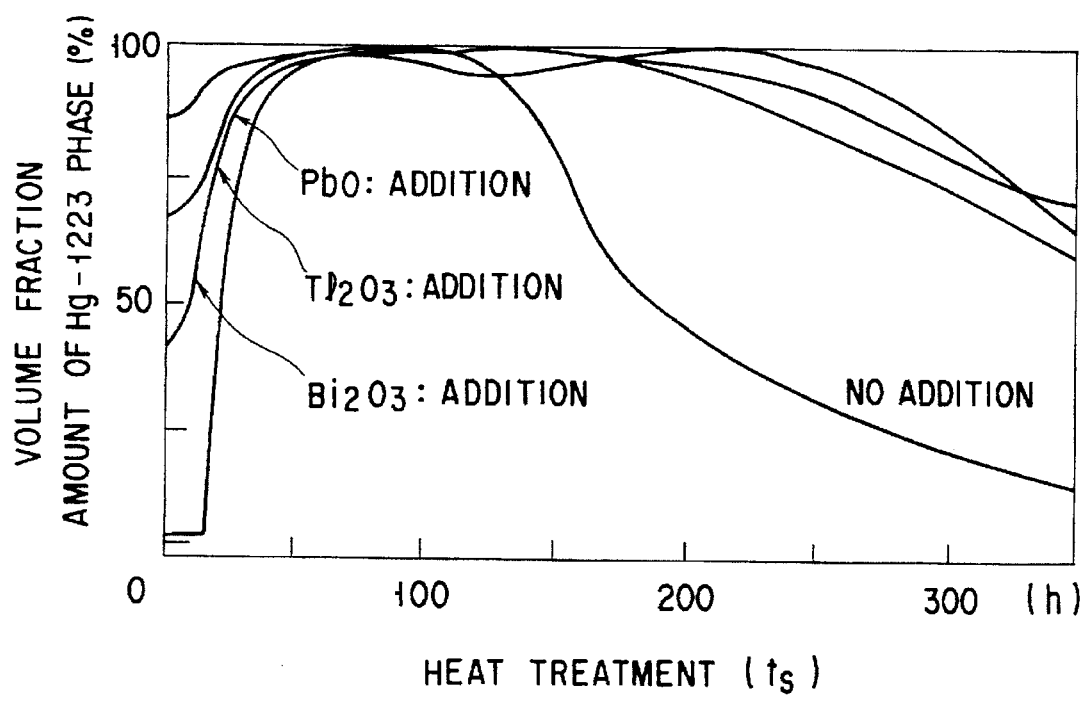
FIG. 2B is a graph showing the relationship between the heat treating time and the volume fraction, which was obtained from the results of powder X-ray diffraction applied to a Hg-series 1223 type oxide superconductor, with PbO, $Tl_2O_3$, and $Bi_2O_3$ addition.

FIG. 2B is a graph showing the relationship between the volume fraction and the time $t_s$ for the heat treatment in respect of the PbO-added Hg-series 1223 type oxide superconductor obtained in Example 2. As apparent from the graph, a high quality Hg-series 1223 type oxide superconductor having a volume fraction of more than 90% can be obtained stably even if the time $t_s$ exceeds 150 hours.

Figure 3B:
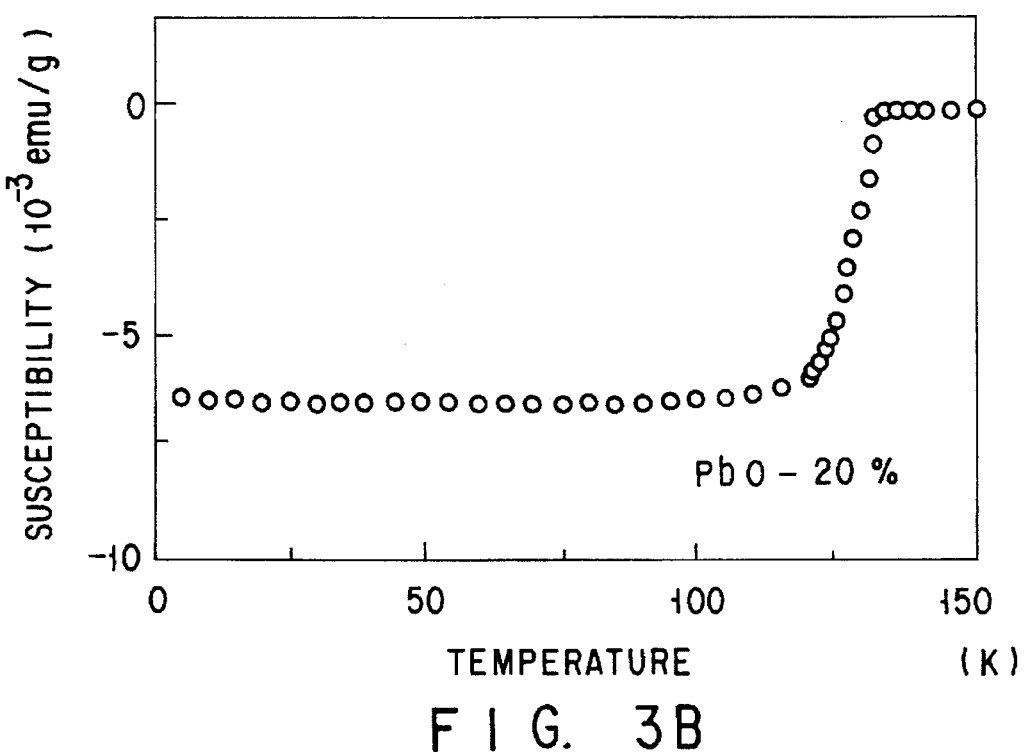
FIG. 3B is a graph showing the relationship between the heat treating time and the susceptibility in respect of a Hg-series 1223 type oxide superconductor, with PbO addition.

Also examined was the relationship between the susceptibility, which was measured by a SQUID magnetometer, and the temperature in respect of the PbO-added Hg-series oxide superconductor, with the results as shown in a graph of FIG. 3B. As seen from the graph, the oxide superconductor exhibited satisfactory superconductive characteristics. Specifically, the oxide superconductor exhibited a diamagnetism at temperatures lower than 133K. Further, the magnitude of the Meissner signal was more than 50% at 5K.

EXAMPLE 3

A $Bi_2O_3$-added Hg-series 1223 type oxide superconductor was prepared as in Example 2, except that 20 mol % of $Bi_2O_3$ was used in Example 3 in place of PbO used in Example 2. FIG. 2B shows the relationship between the volume fraction and the time $t_s$ for the heat treatment in respect of the resultant oxide superconductor. In this experiment, the heat treatment was applied for 168 hours. As apparent from FIG. 2B, a high quality Hg-series oxide superconductor having a volume fraction of 90% or more can be obtained stably in this Example, even if the time $t_s$ exceeds 150 hours.

EXAMPLE 4

A $Tl_2O_3$-added Hg-series 1223 type oxide superconductor was prepared as in Example 2, except that 20 mol % of $Tl_2O_3$ was used in Example 4 in place of PbO used in Example 2. FIG. 2B shows the relationship between the volume fraction and the time $t_s$ for the heat treatment in respect of the resultant oxide superconductor. In this experiment, the heat treatment was applied for 168 hours. As apparent from FIG. 2B, a high quality Hg-series oxide superconductor having a volume fraction of 90% or more can be obtained stably in this Example, even if the time $t_s$ exceeds 150 hours. In Examples 2, 3 and 4 described above, Pb, Bi and Tl were used, respectively, as additive elements. Similar effects can be obtained in the case of using Au, Pt, Ag, Cd or In as an additive element.

(Control)

Powdery materials of $BaCO_3$ having a purity of 99.9%, $CaCO_3$ having a purity of 99.9%, and CuO having a purity of 99.9% were mixed and, then, sintered to obtain $Ba_2Ca_2Cu_3O_7$, followed by adding thereto HgO to obtain a powder mixture.

The resultant powder mixture was press-molded and, then, put in a quartz ampule, as in Example 1. The quartz ampule was then put in an electric furnace and subjected to a heat treatment at 800° to 850° C. for 5 to 10 hours to obtain a Hg-series 1223 type oxide superconductor. A powder X-ray diffraction was applied to the oxide superconductor thus obtained, with the result that the oxide superconductor was found to contain large amounts of impurity phases such as an Hg-series 1212 phase, $BaCuO_2$ phase and $Ca_2CuO_3$ phase. Further, the volume fraction of the Hg-series 1223 type oxide superconductor thus obtained was found to be only 80%.

As described above, the present invention provides a method of manufacturing an oxide superconductor. In the present invention, oxide materials of the metals contained in an oxide superconductor represented by $HgBa_2Ca_2Cu_3O_{8+y}$ are mixed to prepare a powder mixture. Then, the powder mixture is molded to prepare a molded body of a desired shape, followed by applying a heat treatment to the molded body at a temperature sufficient for bringing about a solid phase reaction of the oxide materials for at least 10 hours. The particular method of the present invention can be worked easily and makes it possible to obtain in a large amount a high quality Hg-series 1223 type oxide superconductor having a volume fraction of at least 90%.

Additional advantages and modifications will readily occur to those skilled in the art. Therefore, the invention in its broader aspects is not limited to the specific details, and illustrated examples shown and described herein. Accordingly, various modifications may be made without departing from the spirit or scope of the general inventive concept as defined by the appended claims and their equivalents.

What is claimed is:

1. A method of manufacturing an $HgBa_2Ca_2Cu_3$ oxide superconductor, comprising:

mixing oxide materials of the metals contained in the $HgBa_2Ca_2Cu_3$ oxide superconductor to prepare a powder mixture;

molding said powder mixture to prepare a molded body of a desired shape; and heat treating said molded body within a hermetic container at a pressure of $10^{-1}$ to $10^{-6}$ Torr and at a temperature sufficient for bringing about a solid phase reaction of the oxide materials for at least 20 hours to obtain the $HgBa_2Ca_2Cu_3$ oxide superconductor.

2. The method according to claim 1, wherein said oxide materials are HgO, BaO, CaO and CuO.

3. The method according to claim 2, wherein the metals of said HgO, BaO, CaO and CuO are mixed in a molar ratio of Hg:Ba:Ca:Cu of 1:2:2:3.

4. The method according to claim 3, wherein the heat treating is carried out at a temperature of 600° C. to 750° C.

5. The method according to claim 4, wherein the temperature is 665° C. and the pressure is $1 \times 10^{-4}$ Torr.

6. The method according to claim 1, wherein said oxide materials are mixed by a dry method or a wet method.

7. The method according to claim 1, wherein said powder mixture is molded by a compression molding method.

8. The method according to claim 1, wherein said heat treating is performed at a temperature of between 600° C. and 750° C.

9. A method of manufacturing an Hg-series oxide superconductor, comprising:

mixing at least one additive element selected from the group consisting of Pb, Bi, Tl, Au, Pt, Ag, Cd and In, with oxide materials of the metals contained in the Hg-series oxide superconductor to prepare a powder mixture;

molding said powder mixture to prepare a molded body of a desired shape; and heat treating said molded body within a hermetic container at a pressure of $10^{-1}$ to $10^{-6}$ Torr and at a temperature sufficient for bringing about a solid phase reaction of the oxide materials for at least 10 hours to obtain an Hg-series oxide superconductor.

10. The method according to claim 9, wherein said powder mixture is prepared by mixing HgO, BaO, CaO, CuO and $MO_x$, where M is at least one element selected from the group consisting of Pb, Bi, Tl, Au, Pt, Ag, Cd and In, to achieve a mixing ratio of Hg:Ba:Ca:Cu:M of 1:2:2:3:a of 0.05<a<0.5.

11. The method according to claim 10, wherein the heat treating is carried out at a temperature of 600° C. to 750° C.

12. The method according to claim 9, wherein said heat treating is performed at a temperature of between 600° C. and 750° C.

13. The method according to claim 9, wherein the at least one additive is selected from the group consisting of Pb, Bi, Au, Pt, Ag, Cd and In.

* * * * *